(12) United States Patent
Kanemoto

(10) Patent No.: US 7,569,438 B2
(45) Date of Patent: Aug. 4, 2009

(54) METHOD OF MANUFACTURING SEMICONDUCTOR DEVICE

(75) Inventor: Kei Kanemoto, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 27 days.

(21) Appl. No.: 11/948,504

(22) Filed: Nov. 30, 2007

(65) Prior Publication Data
US 2008/0132043 A1    Jun. 5, 2008

(30) Foreign Application Priority Data
Nov. 30, 2006 (JP) ............................. 2006-323417
Nov. 8, 2007 (JP) ............................. 2007-290781

(51) Int. Cl.
H01L 21/00 (2006.01)

(52) U.S. Cl. ............... 438/164; 438/413; 257/E21.415; 257/E21.564

(58) Field of Classification Search .................. 438/164, 438/165, 295, 300, 413; 257/506, E21.564
See application file for complete search history.

(56) References Cited
U.S. PATENT DOCUMENTS 7,425,495 B2 * 9/2008 Kanemoto .................. 438/424
7,452,781 B2 * 11/2008 Kanemoto .................. 438/311
2007/0138512 A1 * 6/2007 Kanemoto .................. 257/211
2008/0150075 A1 * 6/2008 Chang ......................... 257/506

FOREIGN PATENT DOCUMENTS
JP    A 2006-108205    4/2006

OTHER PUBLICATIONS
Sakai, T. et al. "Separation by Bonding Si Islands (SBSI) for LSI Applications." Abstract of Second International SiGe Technology and Device Meeting, pp. 230-231 (2004).

\* cited by examiner

Primary Examiner—W. David Coleman
Assistant Examiner—Daniel Shook
(74) Attorney, Agent, or Firm—Oliff & Berridge, PLC

(57) ABSTRACT

A method of manufacturing a semiconductor device that includes the steps of forming an oxide film on a surface layer section, forming a window section by selectively removing the oxide film, forming a first semiconductor layer, forming a second semiconductor layer, forming a pair of support member holes for exposing the substrate semiconductor layer, forming a support member on the active surface side of the semiconductor substrate, forming an end-exposed surface exposing at least a part of an end of the first semiconductor layer, forming a substrate semiconductor layer exposed surface, removing the first semiconductor layer below the support member by wet etching, filling a hollow section obtained by the wet etching with an oxide film using thermal oxidation, exposing the second semiconductor layer and providing a semiconductor device to the second semiconductor layer.

8 Claims, 9 Drawing Sheets

METHOD OF MANUFACTURING SEMICONDUCTOR DEVICE

BACKGROUND OF THE INVENTION

1. Technical Field

The present invention relates to a method of manufacturing a semiconductor device, in particular, applying a technology for forming a Silicon On Insulator (SOI) structure.

2. Related Art

A field effect transistor formed on an SOI structure has utility drawing attention in view of its easiness in element separation, latch-up free, small source-drain junction capacitance. In particular, since a complete depletion type SOI transistor can offer low power consumption and high operation speed and is easy to be driven with a low voltage, researches therefor are actively conducted.

As a method of manufacturing a semiconductor device having an SOI structure on a bulk wafer, for example, as described in T. Sakai et al., Second International SiGe Technology and Device Meeting, Meeting Abstract, pp. 230-231, May (2004), there is known a method of forming an SOI layer partially on a silicon substrate using a Separation by Bonding Si Islands (SBSI) method and then forming an SOI transistor in the SOI layer.

The method of forming the SOI structure using the SBSI method described above will be explained. Firstly, a silicon-germanium (SiGe) layer and a silicon (Si) layer are epitaxially grown sequentially on the silicon substrate, and then, a support member hole for supporting the silicon layer is formed. Subsequently, after forming thereon an oxide film and so on, patterning is executed thereon so as to obtain an element forming area and a form of the support member. After then, by selectively etching the silicon-germanium layer existing under the support member with hydrofluoric/nitric acid, the silicon layer is supported by the support member, and at the same time, a hollow section is formed under the silicon layer. Then, by growing oxide films respectively from the silicon substrate side and the silicon layer side using a thermal oxidation process on the hollow section, a buried oxide (BOX) layer is formed between the silicon substrate and the silicon layer. Further, after performing a planarization process on the silicon substrate, etching is performed thereon with an etching liquid such as hydrofluoric acid to expose the silicon layer on the surface, thereby forming the SOI structure on the silicon substrate.

Incidentally, in the forming method of the SOI structure described above, when the SiGe layer is epitaxially grown on the silicon substrate, there is a concern that a material gas for Ge adheres other sites then the desired site on the silicon substrate to cause SiGe to epitaxially grow on unnecessary sites such as side faces or the reverse side of the silicon substrate, thus exerting a harmful influence on the posterior process. Therefore, it is considered that prior to the process of epitaxially growing the SiGe layer, the entire surface of the silicon substrate is covered with a silicon dioxide ($SiO_2$) film, then the silicon dioxide film is selectively removed from the desired site to expose the surface of the silicon substrate, and after then, Si and SiGe are epitaxially grown selectively on only this area. In this way, the problem that SiGe is epitaxially grown on other sites than the desired site on the silicon substrate can be prevented However, if the state in which the silicon substrate is covered by the silicon dioxide film except the desired site is made, and the process proceeds while keeping the state, although the mechanism is not sufficiently figured out, the etching rate to the Si and Ge in SiGe is decreased in the process of selectively etching the SiGe layer described above with hydrofluoric/nitric acid, thus formation of the hollow section preferably penetrating therethrough under the silicon layer is sometimes failed.

SUMMARY

In consideration of the above circumstances, an advantage of the invention is to provide a method capable of manufacturing a superior semiconductor device having an SOI structure by forming a preferable SOI structure while preventing the problem that the hollow section penetrating under the silicon layer is not formed.

The inventor of the present invention obtained the following knowledge as a result of a keen examination of the mechanism regarding that "the etching rate of SiGe is decreased in a process of selectively etching the SiGe layer with hydrofluoric/nitric acid" described above.

In the etching of SiGe with hydrofluoric/nitric acid, firstly $NO_2$ in hydrofluoric/nitric acid takes an electron from Si to become $NO_2{}_-$, thus generating a positive hole (hole) in the Si. The generated positive holes (holes) diffuse up to SiGe to be coupled with Si and Ge, and the SiGe dissolves to be $Si^{2+}$ and $Ge^{2+}$. Since the SiGe easily dissolves in the hydrofluoric/nitric acid according to the above process, as a result, selective etching of the SiGe becomes possible.

Thus, based on the above knowledge, the invention further advanced the research thereon, and completed the invention as a result thereof.

Specifically, according to an aspect of the invention, there is provided a method of manufacturing a semiconductor device, including the steps of forming an oxide film on a surface layer section of an entire surface of a semiconductor substrate, forming a window section by selectively removing the oxide film from an active surface side of the semiconductor substrate, the window section exposing a substrate semiconductor layer forming the semiconductor substrate, forming a first semiconductor layer having an etching selection ratio higher than an etching selection ratio of the substrate semiconductor layer so as to cover the substrate semiconductor layer exposed in the window section;

forming a second semiconductor layer having an etching selection ratio higher than the etching selection ratio of the first semiconductor layer so as to cover the first semiconductor layer, forming a pair of support member holes for exposing the substrate semiconductor layer opened by removing the second semiconductor layer and the first semiconductor layer inside a pair of areas positioned on both sides of an element area section adjacently to the element area section formed using a part of the second semiconductor layer, forming a support member on the active surface side of the semiconductor substrate so as to cover the element area section and to fill at least a part of each of the support member holes, forming an end-exposed surface exposing at least a part of an end of the first semiconductor layer below the support member by etching the second semiconductor layer and the first semiconductor layer using the support member as a mask, forming a substrate semiconductor layer exposed surface by removing at least a part of the oxide film to expose the substrate semiconductor layer after forming the end-exposed surface, removing the first semiconductor layer below the support member by wet etching, filling a hollow section obtained by the wet etching with an oxide film using thermal oxidation, exposing the second semiconductor layer by removing the support member from at least above the element area section, and providing a semiconductor device to the second semiconductor layer.

According to the method of manufacturing a semiconductor device, since at least a part of the oxide film previously formed on the entire surface of the semiconductor substrate such as a Si substrate to expose the substrate semiconductor layer such as Si prior to the step of removing the first semiconductor layer made of single crystal SiGe or the like by wet etching to form a hollow section under the second semiconductor substrate made of single crystal Si or the like, the nitric acid in the hydrofluoric/nitric acid easily oxidizes the semiconductor such as Si on the substrate semiconductor layer exposed surface, thus generating positive holes. Then, the positive hole acts, for example, on the single crystal SiGe (the first semiconductor layer) to ionize the Si, Ge as described above. Thus, the selective etching with the hydrofluoric/nitric acid becomes possible. Therefore, by sufficiently etching the first semiconductor layer, the hollow section can be formed below the second semiconductor layer so as to preferably penetrate therethrough. Consequently, it becomes possible to form a preferable SOI structure.

In the method of manufacturing a semiconductor device of this aspect of the invention, it is preferable that the step of forming the substrate semiconductor layer exposed surface includes the process of covering the active surface side of the semiconductor substrate with a resist, and the process of exposing the substrate semiconductor layer by executing wet etching to remove at least a part of the oxide film in the condition of covering the active surface side of the semiconductor substrate with the resist in the step of forming the substrate semiconductor layer exposed surface.

According to this process, since the active surface side thereof is covered with the resist, the wet etching process can be executed by dipping the semiconductor substrate directly into the etching liquid, and consequently, the process becomes easy.

Further, according to another aspect of the invention, there is provided a method of manufacturing a semiconductor device, including the steps of forming an oxide film on a surface layer section of an entire surface of a semiconductor substrate, forming a window section by selectively removing the oxide film from an active surface side of the semiconductor substrate, the window section exposing a substrate semiconductor layer forming the semiconductor substrate, forming a first semiconductor layer having an etching selection ratio higher than an etching selection ratio of the substrate semiconductor layer so as to cover the substrate semiconductor layer exposed in the window section, forming a second semiconductor layer having an etching selection ratio higher than the etching selection ratio of the first semiconductor layer so as to cover the first semiconductor layer, forming a protective layer capable of providing an etching selection ratio to the second semiconductor layer so as to cover the second semiconductor layer, forming a pair of support member holes for exposing the substrate semiconductor layer opened by removing the protective layer, the second semiconductor layer, and the first semiconductor layer inside a pair of areas positioned on both sides of an element area section adjacently to the element area section formed using a part of the second semiconductor layer, forming a support member capable of providing an etching selection ratio to the protective layer on the active surface side of the semiconductor substrate so as to cover the element area section and to fill at least a part of each of the support member holes, forming an end-exposed surface exposing at least a part of an end of the first semiconductor layer below the support member by etching the protective layer, the first semiconductor layer, and the second semiconductor layer using the support member as a mask, forming a substrate semiconductor layer exposed surface by removing at least a part of the oxide film to expose the substrate semiconductor layer after forming the end-exposed surface, removing the first semiconductor layer below the support member by wet etching, filling a hollow section obtained by the wet etching with an oxide film using thermal oxidation, exposing the protective layer by removing the support member from at least above the element area section, exposing the second semiconductor layer by etching the protective layer, and providing a semiconductor device to the second semiconductor layer.

According to the method of manufacturing a semiconductor device, similarly to the manufacturing method described above, since at least a part of the oxide film previously formed on the entire surface of the semiconductor substrate such as a Si substrate to expose the substrate semiconductor layer such as Si prior to the step of removing the first semiconductor layer made of single crystal SiGe or the like by wet etching to form a hollow section under the second semiconductor substrate made of single crystal Si or the like, the selective etching of the SiGe with the hydrofluoric/nitric acid becomes possible. Therefore, the hollow section can be formed under the second semiconductor layer so as to preferably penetrate therethrough, thus it becomes possible to form the preferable SOI structure.

In the method of manufacturing a semiconductor device of this aspect of the invention, it is preferable that the protective layer is made of silicon nitride.

According to this configuration, since the second semiconductor layer is covered with the protective layer in the step of exposing the substrate semiconductor layer by removing at least a part of the oxide film prior to the step of removing the first semiconductor layer by wet etching, it becomes possible to remove the oxide film by dipping it directly into the etching liquid without covering over the support member on the second semiconductor layer with, for example, a photoresist. Specifically, when removing the oxide film by the wet etching, a part of support member is also etched, thus a part thereof right above the peripheral section of the second semiconductor layer is particularly removed. However, since the protective layer with a sufficient etching selection ratio to the support member remains on the peripheral section, a problem that the thermal oxidation occurs in the peripheral section of the second semiconductor layer to form a thick oxide film in the peripheral section in the posterior step of filling the hollow section with the oxide film by the thermal oxidation can be prevented. Therefore, since it can be dipped directly into the etching liquid without covering over the support member on the second semiconductor layer with a photoresist or the like as described above, the process can be simplified.

Further, in the case in which the step of exposing the protective layer by removing the support member from at least above the element area section is executed using a chemical mechanical polishing (CMP) process, the protective layer can be made function as a stopper layer in the chemical mechanical polishing process.

Further, in the method of manufacturing a semiconductor device of the above aspects of the invention, it is preferable that in the step of forming the substrate semiconductor layer exposed surface, the substrate semiconductor layer is exposed by removing the oxide film on a surface of the semiconductor substrate on a side opposite to the active surface side.

According to this process, since the surface on the opposite side to the active surface, namely the entire reverse side surface of the semiconductor substrate can be exposed, generation of the hole by hydrofluoric/nitric acid described above becomes to occur in a wide range, thus the removal of the first semiconductor layer made of SiGe or the like by wet etching becomes to be performed more preferably.

Further, since the semiconductor substrate has, for example, a thickness as small as about several hundreds of micrometers, the hole generated on the reverse side becomes to be conducted relatively fast to the obverse side to be the active surface, and consequently, also from this reason, the removal of the first semiconductor layer by wet etching becomes to more preferably be performed.

Further, in the method of manufacturing a semiconductor device of the above aspects of the invention, it is preferable that in the step of forming the substrate semiconductor layer exposed surface, the substrate semiconductor layer is exposed by dry-etching a surface of the semiconductor substrate on a side opposite to the active surface side to remove the oxide film on the surface opposite to the active surface side.

According to this process, since the surface on the side opposite to the active surface side can selectively be etched by the dry etching process, such a process as to cover the active surface side with a photoresist or the like can be eliminated, thus the process can be simplified.

Further, in the method of manufacturing a semiconductor device of the above aspects of the invention, it is preferable that the substrate semiconductor layer and the second semiconductor layer are made of single crystal silicon, and the first semiconductor layer is made of single crystal silicon-germanium.

According to this process, a preferable SOI structure can be formed by an SBSI method.

Further, in the method of manufacturing a semiconductor device of the above aspects of the invention, it is preferable that the step of forming a buffer layer made of single crystal silicon on the semiconductor substrate is further provided prior to the step of forming the first semiconductor layer.

According to this process, by forming the buffer layer prior to forming the first semiconductor layer, it can be suppressed that a microscopic defect in the semiconductor substrate exerts a harmful influence on the first and second semiconductor layers. Therefore, an SOI structure with improved quality, yield, and so on can be obtained.

BRIEF DESCRIPTION OF THE DRAWINGS

The invention will now be described with reference to the accompanying drawings, wherein like numbers refer to like elements.

FIGS. 5A and 5B are diagrams showing a substantial part thereof, wherein FIG. 5A is a schematic side cross-sectional view, and FIG. 5B is a schematic plan view.

FIGS. 7A and 7B are diagrams showing a substantial part thereof, wherein FIG. 7A is a schematic side cross-sectional view, and FIG. 7B is a schematic plan view.

FIGS. 8A and 8B are diagrams showing a substantial part thereof, wherein FIG. 8A is a schematic side cross-sectional view, and FIG. 5B is a schematic plan view.

FIGS. 9A and 9B are diagrams showing a substantial part thereof, wherein FIG. 9A is a schematic side cross-sectional view, and FIG. 9B is a schematic plan view.

FIGS. 15A and 15B are diagrams showing a substantial part thereof, wherein FIG. 15A is a schematic side cross-sectional view, and FIG. 15B is a schematic plan view.

DESCRIPTION OF EXEMPLARY EMBODIMENTS

A method of manufacturing a semiconductor device according to an embodiment of the invention will hereinafter be described in detail with reference to the accompanying drawings.

FIGS. 1 through 14 are schematic diagrams showing a first embodiment of a method of manufacturing a semiconductor device according to the invention in an order of the steps. It should be noted that in these schematic drawings, for the sake of convenience of illustration, scale sizes of members or parts may be expressed differently from the actual sizes thereof.

Figure 1:
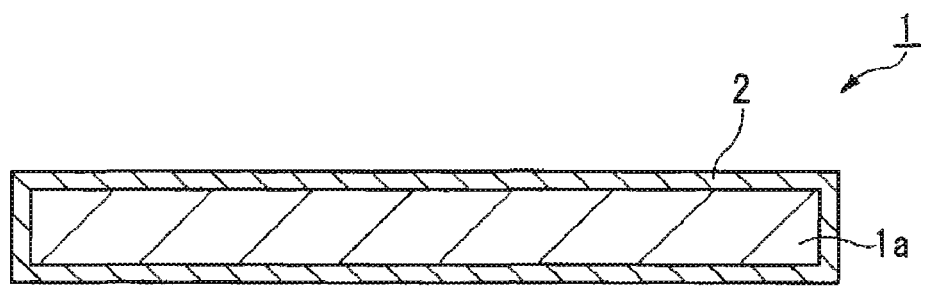
FIG. 1 is a schematic side cross-sectional view for explaining a process of a manufacturing method according to an embodiment of the invention.

Firstly, as shown in FIG. 1, a semiconductor substrate 1 made of single crystal silicon is prepared, and a thermal oxidation process is executed thereon, thereby forming an oxidized film of the semiconductor, namely a silicon dioxide film 2, on the entire surface layer thereof.

Figure 2:
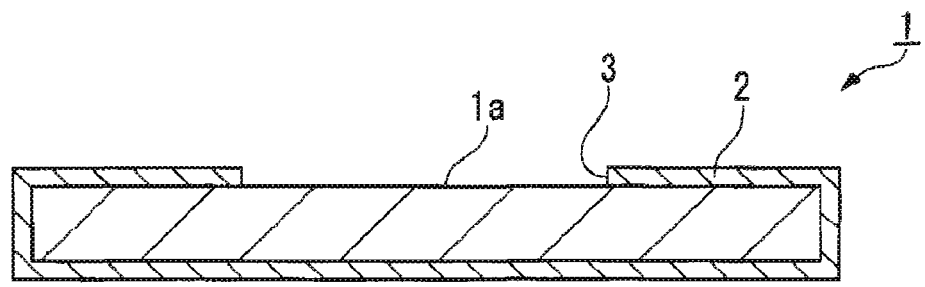
FIG. 2 is a schematic side cross-sectional view for explaining a process of a manufacturing method according to an embodiment of the invention.

Subsequently, the silicon dioxide film 2 is selectively removed from an active surface side of the semiconductor substrate 1 using a photolithography technology and an etching technology, thus a window section 3 with a rectangular planar shape is formed, as shown in FIG. 2, in a site including an area where the SOI structure is formed. Thus, the single crystal silicon forming the semiconductor substrate 1, namely a substrate semiconductor layer 1a is exposed inside the window section 3. It should be noted that although FIG. 2 shows only one window section 3 for simplification, it is assumed that in the actual case a number of window sections 3 are formed, and the following steps are executed simultaneously on all of the window sections 3.

Figure 3:
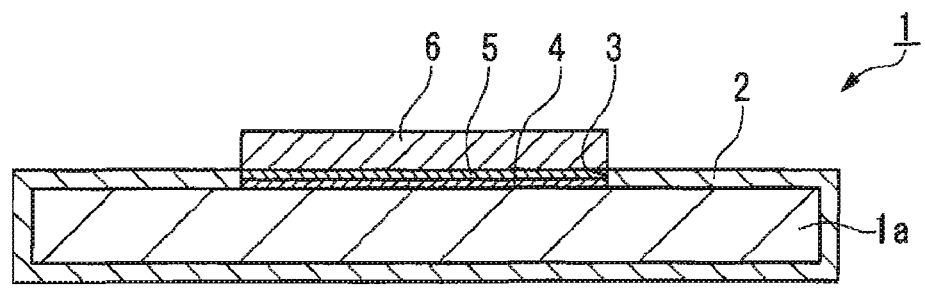
FIG. 3 is a schematic side cross-sectional view for explaining a process of a manufacturing method according to an embodiment of the invention.

Subsequently, as shown in FIG. 3, silicon (Si) is epitaxially grown selectively on the substrate semiconductor layer 1a exposed inside the window sections 3 so as to cover the exposed substrate semiconductor layer 1a to form a buffer layer 4 made of Si with a thickness of about 20 nm. Regarding this epitaxial growth, a vapor phase method using disilane ($Si_2H_6$) as a material gas is preferably adopted. It should be noted here that the buffer layer 4 is for improving the crystallinity of a single crystal SiGe layer 5 formed thereon and further a single crystal Si layer 6 formed on the single crystal SiGe layer 5 as described later.

Subsequently, silicon-germanium (SiGe) is epitaxially grown on the buffer layer 4 so as to cover the buffer layer 4 to form a single crystal SiGe layer (a first semiconductor layer) 5 with a thickness of about 30 nm. Regarding this epitaxial growth, a vapor phase method using disilane ($Si_2H_6$) and germane (GeH4) as material gases is preferably adopted. It should be noted that the single crystal SiGe layer 5 has a high selection ratio to the substrate semiconductor layer 1a made of single crystal silicon, and further to the buffer layer 4 made of the same single crystal silicon in the case of using hydrofluoric/nitric acid as the etching liquid as described later.

Subsequently, silicon (Si) is epitaxially grown on the single crystal SiGe layer 5 so as to cover the single crystal SiGe layer 5 to form a single crystal Si layer (a second semiconductor layer) 6 with a thickness of about 100 nm. Regarding this epitaxial growth, a vapor phase method using disilane ($Si_2H_6$) as a material gas is preferably adopted similarly to the case with the buffer layer. It should be noted that since the single crystal Si layer 6 is made of single crystal silicon as described above, the etching selection ratio thereof to the single crystal SiGe layer 5 is small in the case of using hydrofluoric/nitric acid as the etching liquid.

It should be noted that although regarding these buffer layer 4, single crystal SiGe layer 5, and single crystal Si layer 6, these layers are selectively formed in the window sections 3 as described above by appropriately setting the conditions of the epitaxial growth, in some conditions, a polysilicon film corresponding to the buffer layer 4, a polycrystalline silicon-germanium film corresponding to the single crystal SiGe layer 5, and a polysilicon film corresponding to the single crystal Si layer 6 may be formed in this order on the silicon dioxide film 2 outside the window sections 3. In this case, it is arranged to selectively remove these films using a photolithography technology and an etching technology to keep the buffer layer 4, the single crystal SiGe layer 5, and the single crystal Si layer 6 only in the window sections 3.

Figure 4:
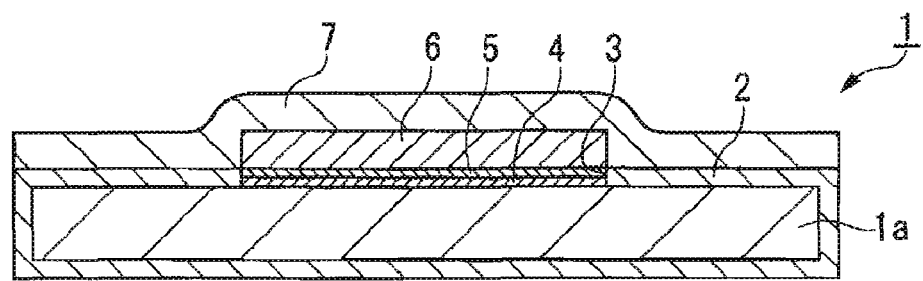
FIG. 4 is a schematic side cross-sectional view for explaining a process of a manufacturing method according to an embodiment of the invention.

Subsequently, as shown in FIG. 4, silicon nitride (SiN) is formed on a surface of the semiconductor substrate on the active surface side, namely the side on which the window sections 3 have been formed with a thickness in a range of about 100 through 200 nm by a plasma CVD process, thus forming a protective layer 7 on the single crystal Si layer 6. By adopting the plasma CVD process, and making the plasma generation area correspond to the film forming surface, it is possible to form a silicon nitride film on the surface of the semiconductor substrate 1 only on the set side, the active surface side in the present embodiment. Further, by thus forming the protective layer 7 with silicon nitride, it becomes possible to provide etching selection ratio to the single crystal Si layer 6 as the second semiconductor layer.

Figure 5A:
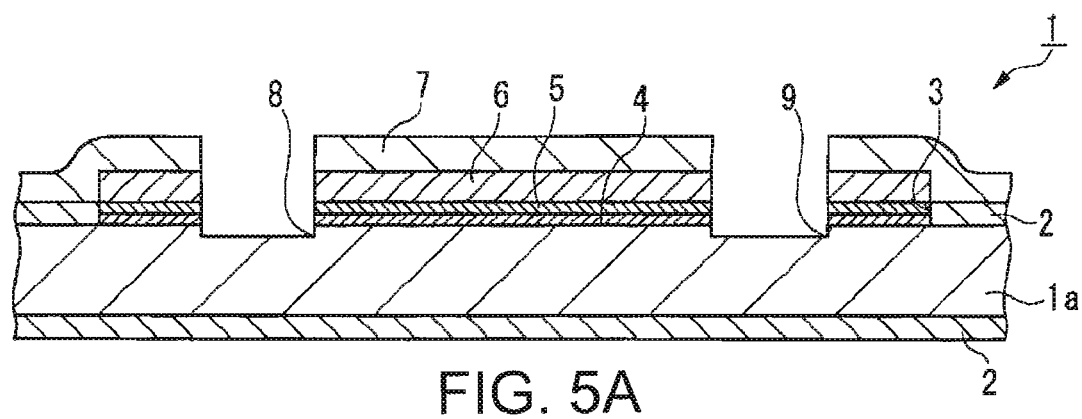
Figure 5B:
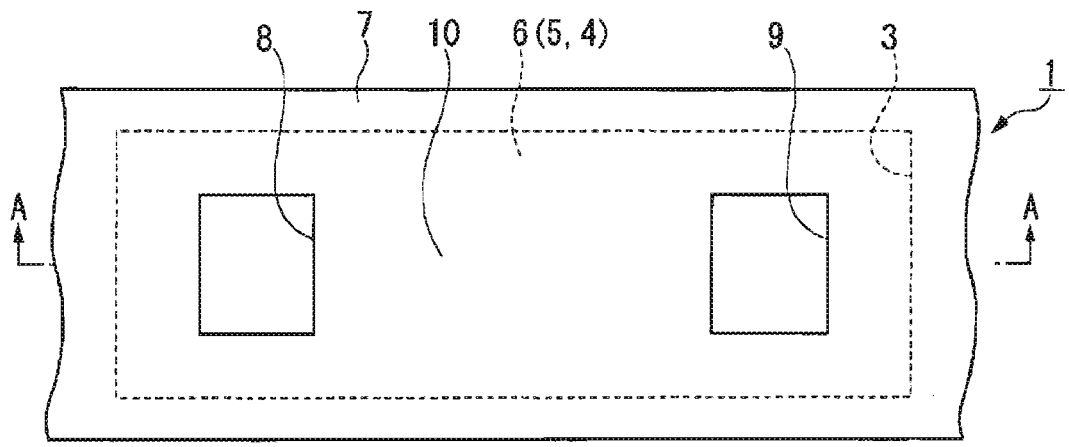

Subsequently, as shown in FIGS. 5A and 5B, a part of each of the protective layer 7; the single crystal Si layer 6, the single crystal SiGe layer 5, the buffer layer 4, and the substrate semiconductor layer 1a in areas positioned to have an element area section described later therebetween is removed to form openings, thereby providing a first support member hole 8 and a second support member hole 9. It should be noted that FIG. 5A is a cross-sectional view along the A-A arrow line on FIG. 5B (the same applies below). Specifically, a resist pattern (not shown) having openings in areas respectively corresponding to an area 8a for forming the first support member hole 8 and an area 9a for forming the second support member hole 9 is firstly formed using a photolithography technology. Subsequently, using the resist pattern as a mask, a part of each of the protective layer 7, the single crystal Si layer 6, the single crystal SiGe layer 5, the buffer layer 4, and the substrate semiconductor layer 1a positioned each of the areas 8a, 9a is sequentially removed by dry etching.

Thus, the element area section formed using a part of the single crystal Si layer 6 is formed between the first support member hole 8 and the second support member hole 9. In other words, the area defined between the first support member hole 8 and the second support member hole 9 should become the element area section (an SOI forming area) 10.

Figure 6:
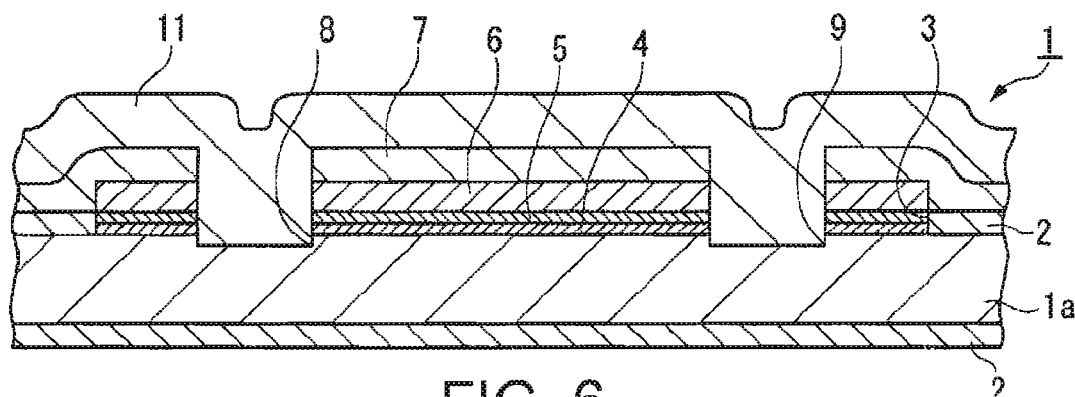
FIG. 6 is a schematic side cross-sectional view for explaining a process of a manufacturing method according to an embodiment of the invention.

Subsequently, as shown in FIG. 6, a, support member precursor layer 11 for forming a support member is formed on the entire surface of the semiconductor substrate 1 on the active surface side thereof. In the present embodiment, a silicon dioxide ($SiO_2$) film is formed to have a thickness of about 400 nm by a chemical vapor deposition (CVD) method in the condition of filling the first support member hole 8 and the second support member hole 9 and covering the protective layer 7, thus forming the support member precursor layer 11. It should be noted that as the film forming conditions of the support member precursor layer 11, the process should be performed at a temperature at which the germanium (Ge) included in the single crystal SiGe layer 5 does not diffuse in the single crystal Si layer 6.

Figure 7A:
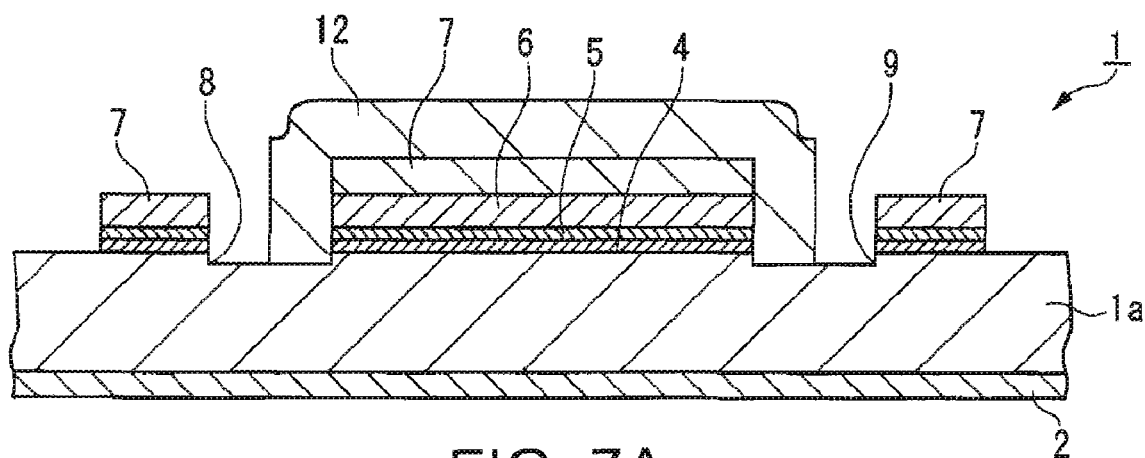
Figure 7B:
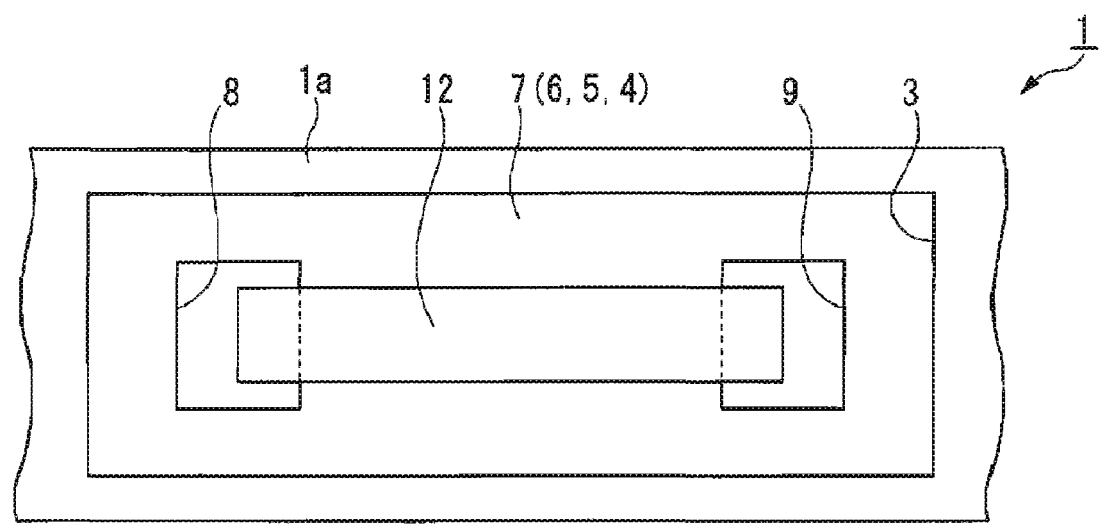

Subsequently, by patterning the support member precursor layer 11, as shown in FIGS. 7A and 7B, a support member 12 is formed in the condition of covering the element area section 10 and filling a part of each of the first support member hole 8 and the second support member hole 9. Specifically, a resist pattern (not shown) is formed by a photolithography technology, and the support member 12 is obtained by performing pattering by dry etching using the resist pattern as a mask. Further, by thus etching the support member precursor layer 1, the silicon dioxide film 2 exposed on the active surface side can also be removed. It should be noted that since the support member 12 thus obtained is made of silicon dioxide ($SiO_2$), the etching selection ratio to the protective layer 7 made of silicon nitride (SiN) can be gained as described later.

Figure 8A:
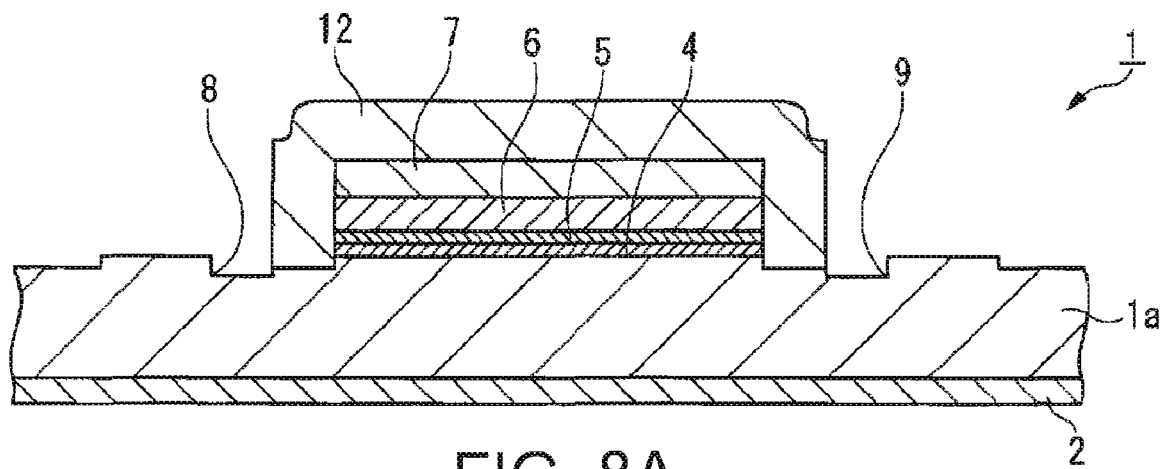

After forming the support member 12 using the resist pattern (not shown) as a mask as described above, the protective layer 7 exposed on the active surface side is subsequently removed by dry etching as shown in FIG. 8A while keeping the protective layer 7 right under the support member 12.

Figure 8B:
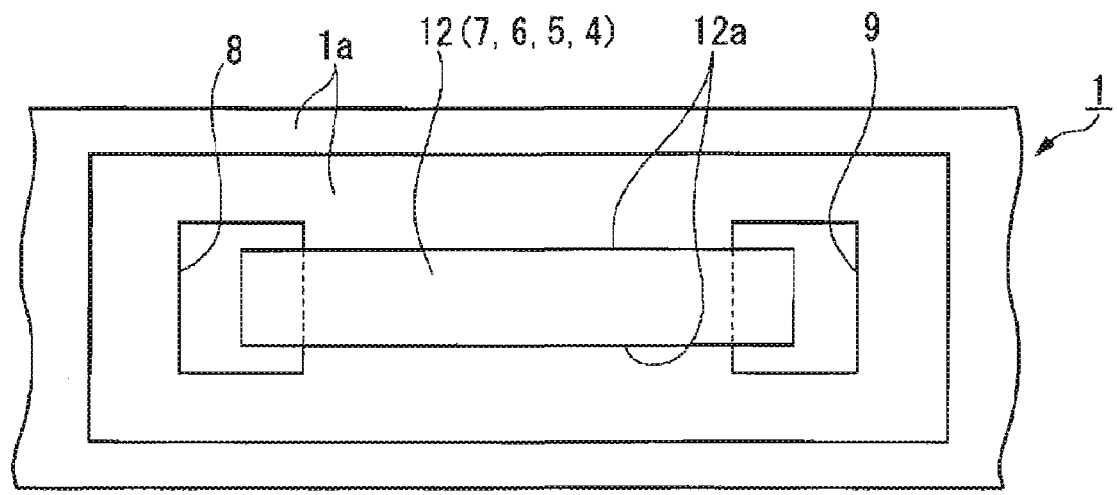

Further, a part of each of the single crystal Si layer 6, the single crystal SiGe layer 5, the buffer layer 4, and the substrate semiconductor layer 1a is sequentially removed by dry etching using the resist pattern and the support member 12 as a mask. According to the above process, both side surfaces of the support member 12, namely the side surfaces 12a along the lines connecting the first support member hole 8 and the second support member hole 9 are exposed as shown in FIG. 8B. At the same time, regarding the protective layer 7, the single crystal Si layer 6, the single crystal SiGe layer 5, and the buffer layer 4 remaining right under the support member 12, the both side surfaces thereof (end faces) positioned right under the side surfaces 12a are also exposed, forming end-exposed surfaces in the embodiment of the invention. After then, the resist pattern on the support member 12 is removed. It should be noted that since the protective layer 7, the single crystal Si layer 6, the single crystal SiGe layer 5, and the buffer layer 4 are each patterned as described above, the support member 12 is arranged to support the single crystal Si layer 6 via the protective layer 7.

Figure 9A:
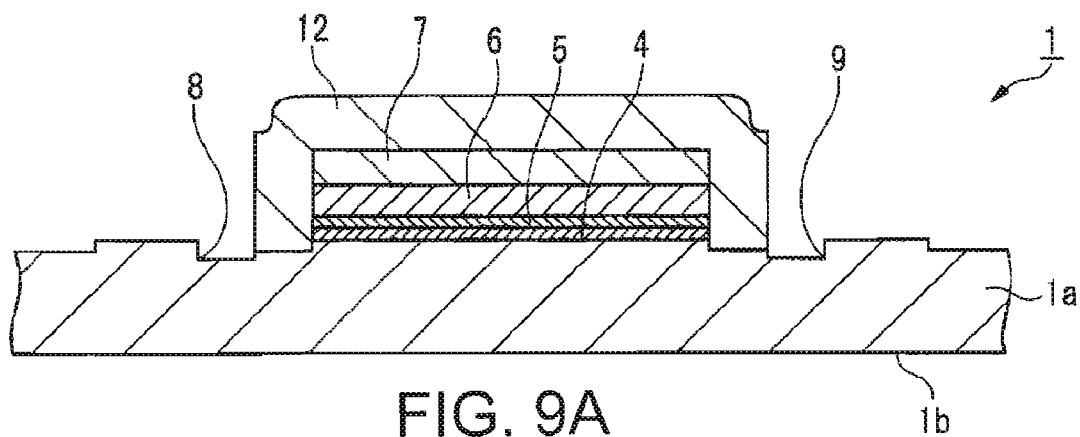
Figure 9B:
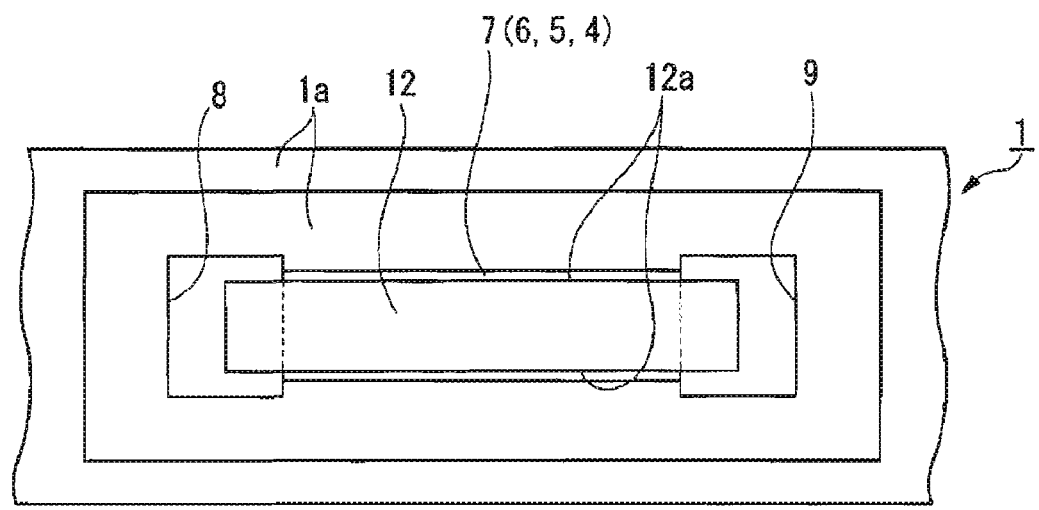

After thus forming the end-exposed surfaces, the semiconductor substrate 1 is subsequently dipped (whole-dipping) into hydrofluoric acid as an etching liquid directly without being coated with a photo resist or the like, as shown in FIGS. 9A and 9B, to remove the silicon dioxide film 2 remaining on the surface layer section of the semiconductor substrate 1. Specifically, the silicon dioxide film 2 formed on the surface of the semiconductor substrate 1 on the side opposite to the active surface side and further the side surfaces of the semiconductor substrate 1 is removed to expose the substrate semiconductor layer 1a, thus forming a substrate semiconductor layer exposed surface 1b on the reverse side surface and so on of the semiconductor substrate 1.

When the semiconductor substrate 1 is thus dipped into hydrofluoric acid (the etching liquid), since the support member 12 is also made of silicon dioxide, a part of the support member 12 is etched, and in particular, a part thereof right above a part of the peripheral section of the single crystal Si layer 6, specifically right above the peripheral section thereof on the end-exposed surface side is to be removed. FIG. 9B shows this state, and in comparison with FIG. 8B, the protective layer 7 can be observed on the sides of the side surfaces 12a of the support member 12. This is because the support member 12 is etched to be thinner, thus exposing a part of the protective layer 7 as a foundation layer.

As described above, as shown in FIG. 9B, above the peripheral section of the single crystal Si layer 6, there remains the protective layer 7 made of silicon nitride insoluble with hydrofluoric acid and having the etching selection ratio to the support member 12 made of silicon dioxide. Therefore, the peripheral section of the single crystal Si layer 6 is covered by the protective layer 7 so as not to be exposed outside, thus being protected by the protective layer 7.

Figure 10:
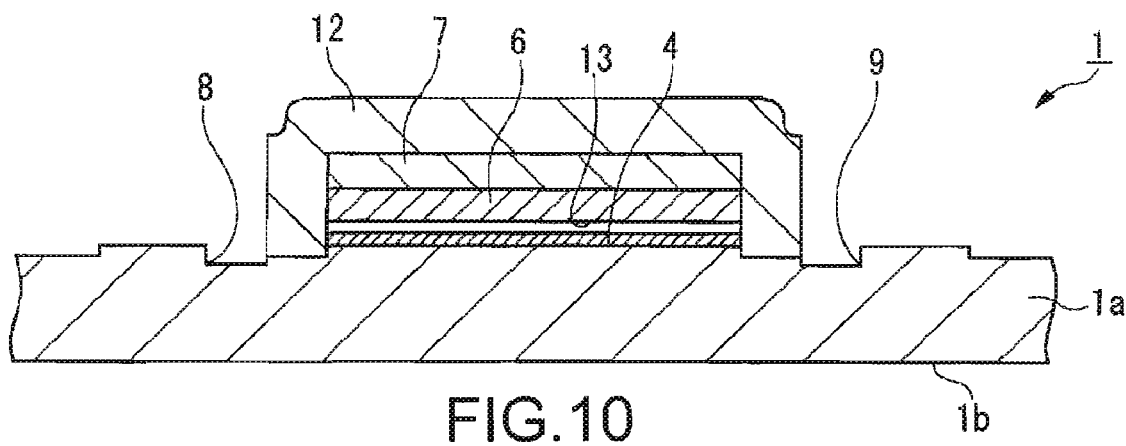
FIG. 10 is a schematic side cross-sectional view for explaining a process of a manufacturing method according to an embodiment of the invention.

Subsequently, as shown in FIG. 10, the single crystal SiGe layer 5 positioned below the support member 12 is selectively removed by wet etching using hydrofluoric/nitric acid. Specifically, the reverse side (the side of the surface opposite to the active surface) of the semiconductor substrate 1 is firstly dipped into hydrofluoric/nitric acid, thus making the single crystal SiGe layer 5 positioned below the support member 12 have contact with the etching liquid such as hydrofluoric/nitric acid. Then, since the single crystal Si layer 6 has the smaller etching selection ratio than the single crystal SiGe layer 5, and is consequently slow in etching rate, the single crystal Si layer 6 remains unetched while the single crystal SiGe layer 5 is selectively etched to be removed. Similarly, the buffer layer 4 and the semiconductor substrate 1 (the substrate semiconductor layer 1a) also remain unetched. Therefore, after the single crystal SiGe layer 5 is selectively etched, a hollow section 13 should be formed between the buffer layer 4 and the single crystal Si layer 6.

Here, it is conceivable that such etching of the single crystal SiGe layer 5 with hydrofluoric/nitric acid is caused by the mechanism described above. That is, $NO_2$ in hydrofluoric/nitric acid takes an electron from Si to become $NO_{2-}$, thus generating a positive hole (hole) in the Si. The generated positive holes (holes) diffuse up to SiGe to be coupled with Si and Ge, and the SiGe dissolves to be $Si^{2+}$ and $Ge^{2+}$. Since the SiGe easily dissolves in the hydrofluoric/nitric acid according to the above process, as a result, selective etching of the SiGe becomes possible. Therefore, by sufficiently etching the single crystal SiGe layer 5, the hollow section 13 is formed under the single crystal Si layer 6 so as to preferably penetrate therethrough.

It is conceivable that the positive hole generated by oxidizing Si in the semiconductor substrate 1 reaches the inside of the single crystal SiGe layer 5 passing through Si as a result of both of two phenomena that the hole is transmitted by being conducted between the adjacent Si atoms, and that a procedure that the generated hole acts on a Si atom adjacent to the hole to ionize the atom, and then the newly generated hole acts on a Si atom adjacent to the newly generated hole is sequentially repeated.

Therefore, since the entire reverse side surface of the semiconductor substrate 1 is particularly exposed in the present embodiment, generation of the hole by hydrofluoric/nitric acid described above becomes to occur in a wide range, thus the removal of the single crystal SiGe layer 5 by wet etching becomes to be performed more preferably. Further, since the semiconductor substrate 1 has, for example, a thickness as small as about 650 µm, the hole generated on the reverse side becomes to be conducted relatively fast to the obverse side to be the active surface, and consequently, also from this reason, the removal of the single crystal SiGe layer 5 by wet etching becomes to more preferably be performed.

Figure 11:
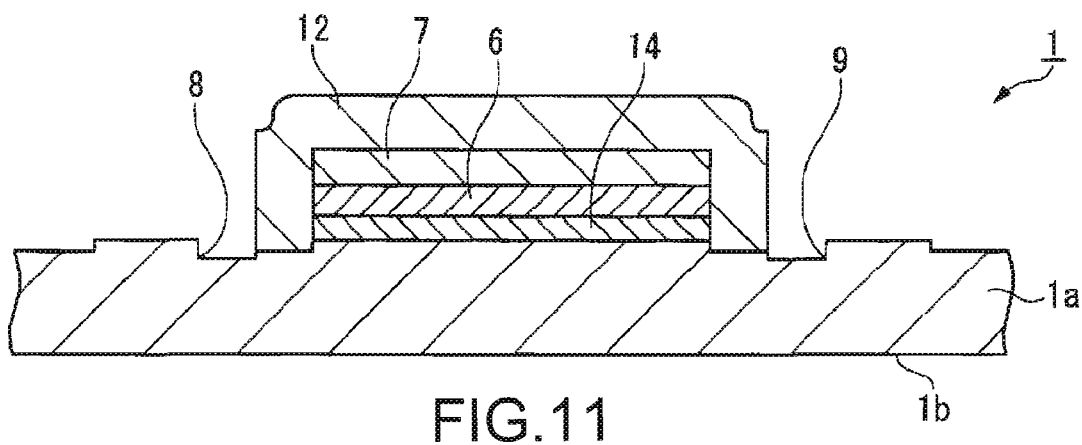
FIG. 11 is a schematic side cross-sectional view for explaining a process of a manufacturing method according to an embodiment of the invention.

Subsequently, by executing thermal oxidation process, a buried oxide layer 14 (BOX layer) is provided to the hollow section 13 as shown in FIG. 11. Specifically, by thus executing the thermal oxidation process, the buffer layer 4 (further the semiconductor substrate 1) and the single crystal Si layer 6 disposed respectively on the lower and upper sides of the hollow section 13 are oxidized by reacting with oxygen on the side of the hollow section 13, thus growing as silicon dioxide ($SiO_2$) to form thick films. Thus, the entire inside of the hollow section 13 becomes to be filled with silicon dioxide (the buried oxide layer 14).

On this occasion, since the support member 12 is provided above the single crystal Si layer 6 via the protective layer 7, oxidation of the upper side of the single crystal Si layer 6 is prevented, and consequently, film reduction of the single crystal Si layer 6 is inhibited. Further, since the buffer layer 4 has a thickness as small as about 20 nm, after the whole buffer layer 4 has been oxidized, the surface of the semiconductor substrate 1 (the substrate semiconductor layer 1a) is oxidized to form a part of the buried oxide layer 14. It should be noted that in the case of not forming the buffer layer 4, the surface of the semiconductor substrate 1 (the substrate semiconductor layer 1a) is oxidized from the beginning, and becomes to form the buried oxide layer 14 together with the silicon dioxide generated from the single crystal Si layer 6.

Further, although in the thermal oxidation process, the exposed lower surface (the surface on the side of the hollow section 13) and exposed side surface (the end-exposed surface) of the single crystal Si layer 6 react with oxygen to be oxidized into silicon dioxide (the buried oxide layer 14), the part of the single crystal Si layer 6 right above the peripheral section on the side surface side is covered with the protective layer 7 so as not to be exposed, and consequently kept in the state of single crystal silicon without being oxidized. Therefore, the part thereof right above the peripheral section on the side surface side also becomes to function as a part of the area forming the SOI structure.

Figure 12:
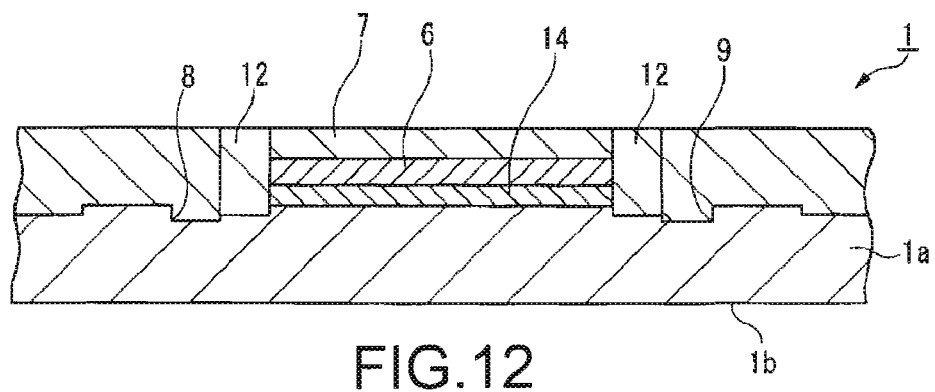
FIG. 12 is a schematic side cross-sectional view for explaining a process of a manufacturing method according to an embodiment of the invention.

Subsequently, as shown in FIG. 12, the entire surface above the semiconductor substrate 1 is planarized. Specifically, in order for electrically isolating the SOI structure, a silicon dioxide ($SiO_2$) film is firstly formed to have a thickness of about 1 μm on the entire active surface of the semiconductor substrate 1 by a CVD process or the like, thus forming a planarization insulating film (not shown). Subsequently, the active surface side of the semiconductor substrate 1 is planarized by a chemical mechanical polishing (CMP) process, thus the planarization insulating film and the support member 12 are removed to expose the protective layer 7. On this occasion, by making the protective layer 7 located under the support member 12 function as a stopper layer, the end-point of the CMP process can easily be controlled. It should be noted that a part of the support member 12 remains inside each of the first support member hole 8 and the second support member hole 9.

Figure 13:
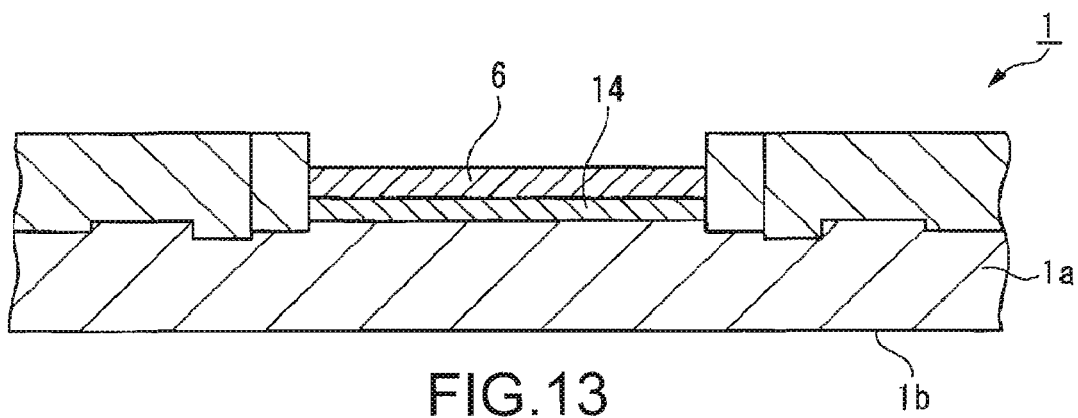
FIG. 13 is a schematic side cross-sectional view for explaining a process of a manufacturing method according to an embodiment of the invention.

Subsequently, as shown in FIG. 13, the protective layer 7 is removed by wet etching with hot phosphoric acid to expose the single crystal Si layer 6. It should be noted that since hot phosphoric acid hardly solves silicon dioxide, the buried oxide layer 14, for example, is not dissolved by such wet etching with hot phosphoric acid. Therefore, such a problem that a separation between the silicon dioxide on the side of the buffer layer 4 and the silicon dioxide on the side of the single crystal Si layer 6 in the buried oxide layer 14 occurs in a posterior process can be prevented.

According to the above steps, there can be formed the single crystal Si layer 6 surrounded in the periphery thereof by a part of the support member 12 and the planarization insulating film and isolated from the semiconductor substrate 1 with the buried oxide layer 14.

Figure 14:
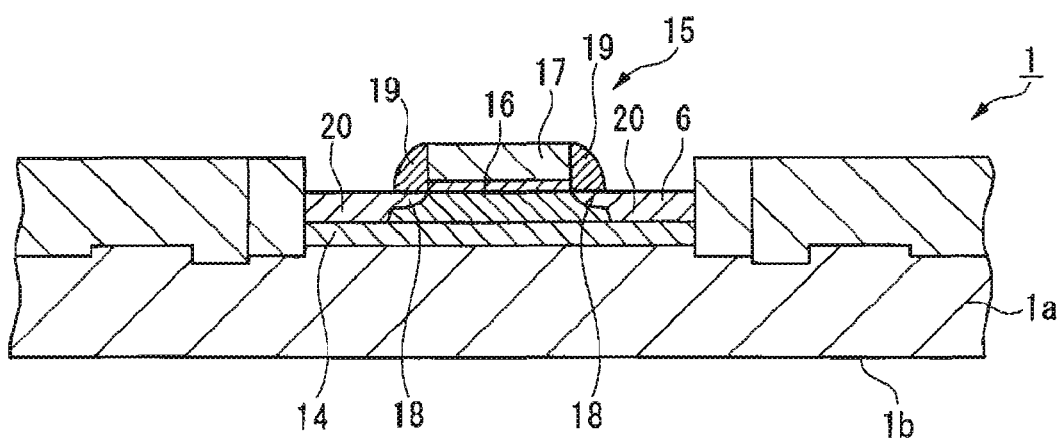
FIG. 14 is a schematic side cross-sectional view for explaining a process of a manufacturing method according to an embodiment of the invention.

Subsequently, as shown in FIG. 14, a semiconductor device 15 is formed using the single crystal Si layer 6. Specifically, thermal oxidation is firstly executed on the surface of the single crystal Si layer 6 to form a gate insulating film 16. Then, a polysilicon layer is formed on the gate insulating film 16 by, for example, a CVD process. Subsequently, by patterning the polysilicon layer using a photolithography technology and an etching technology, a gate electrode 17 is formed on the gate insulating film 16.

Subsequently, impurities such as As (arsenic), P (phosphorus) B (boron) are implanted into the single crystal Si layer 6 using the gate electrode 17 as a mask to form LDD layers 18 as low concentration impurity introduction layers on both sides of the gate electrode 17 on the single crystal Si layer 6. Then, using a CVD method or the like, an insulating layer (not shown) is formed on the single crystal Si layer 6 provided with the LDD layers 18, and by etching back the insulating layer using a dry etching process such as a reactive ion etching (RIE) process, sidewalls 19 are formed on both sidewalls of the gate electrode 17.

Subsequently, using the gate electrode 17 and the sidewalls 19 as a mask, impurities such as As, P, or B are implanted into the single crystal Si layer 6. Thus, source/drain regions 20 formed of high concentration impurity introduction layers are formed in the single crystal Si layer 6 and adjacently to the sidewalls 19, thus obtaining a transistor (a semiconductor device 15). In addition, by forming a bulk element in a bulk forming region (not shown), a semiconductor device mixedly mounting the SI element and the bulk element on the semiconductor substrate 1 can be formed.

According to the present manufacturing method, prior to the step of removing the single crystal SiGe layer 5 by wet etching and forming the hollow section 13 under the single crystal Si layer 6, the silicon dioxide film 2 previously formed on the reverse side and the side surface of the semiconductor substrate 1 is removed to expose the substrate semiconductor layer 1a, and consequently, the selective etching of the SiGe layer with hydrofluoric/nitric acid can more preferably be performed. Therefore, the hollow section 13 can be formed under the single crystal Si layer 6 so as to preferably penetrate therethrough, thus the preferable SOI structure can be formed.

Further, since the protective layer 7 made of silicon nitride is formed so as to cover the single crystal Si layer 6, when removing the silicon dioxide film 2 to expose the substrate semiconductor layer 1a prior to removing the single crystal SiGe layer 5 by wet etching, the silicon dioxide film 2 can be removed by directly dipping into the etching liquid without covering the support member 12 with, for example, photoresist, thus the process can be simplified. This is because, although there is a concern that when removing the silicon dioxide film 2 by the wet etching, a part of the support member 12 is also etched, thus exposing the upper surface of the peripheral section of the single crystal Si layer 6, since this section is covered with the protective layer 7, such a concern can be resolved. A second embodiment of a method of manufacturing a device thereafter will be explained.

The second embodiment is mainly different from the first embodiment described above in that the support member 12 is directly formed without forming the protective layer 7 on the single crystal Si layer 6, and that the active surface side of the semiconductor substrate 1 is covered with a resist when forming the substrate semiconductor layer exposed surface 1b prior to removing the single crystal SiGe layer 5 by wet etching.

Figure 15A:
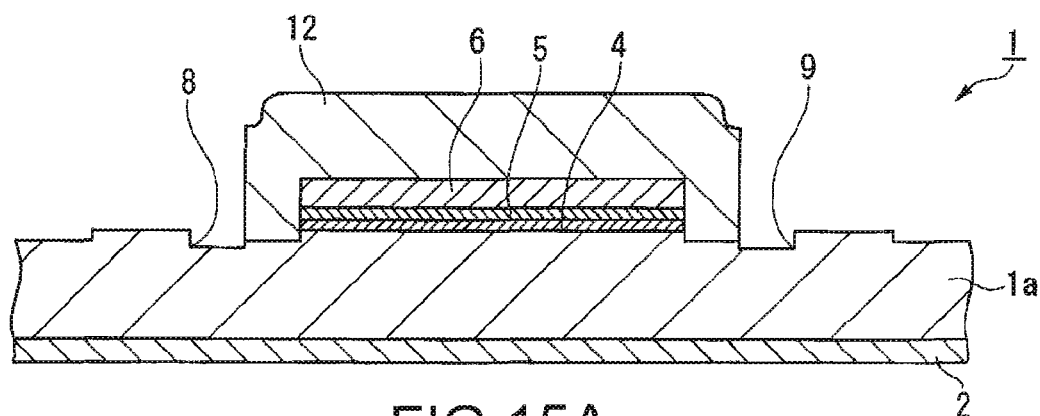
Figure 15B:
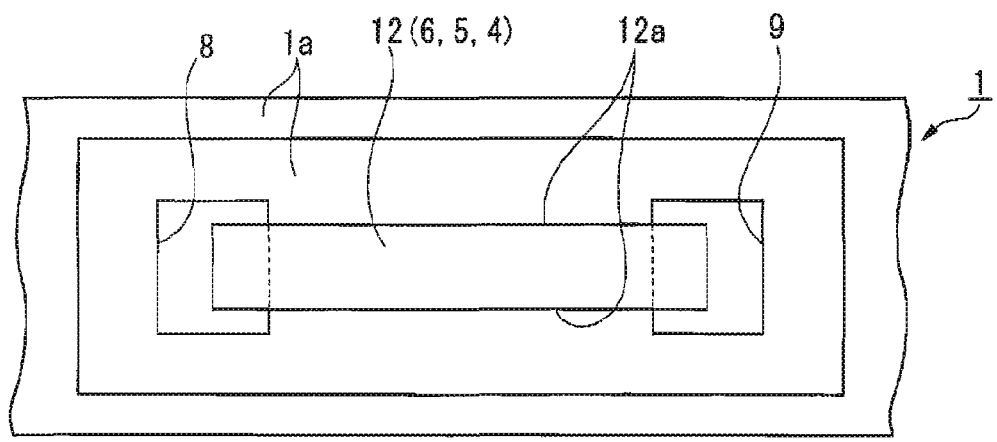

In other words, in the present embodiment, by going through similar steps to the first embodiment except that the protective layer 7 is not formed on the single crystal Si layer 6, as shown in FIGS. 15A and 15B, the both side surfaces 12a of the support member 12 are exposed, and at the same time, the both side surfaces (end faces) of each of the single crystal Si layer 6, the single crystal SiGe layer 5, and the buffer layer 4 remaining right below the support member 12 are also exposed right below the side surface 12a, thus forming the end-exposed surfaces. By thus arranged, in the present embodiment since the single crystal Si layer 6, the single crystal SiGe layer 5, and the buffer layer 4 are each patterned, the support member 12 becomes to directly support the single crystal Si layer 6.

Figure 16:
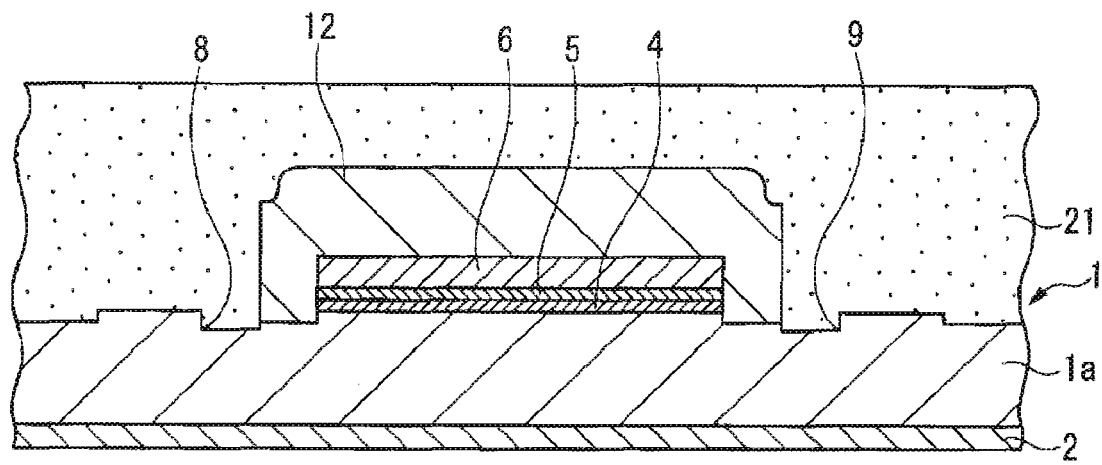
FIG. 16 is a schematic side cross-sectional view for explaining a process of a manufacturing method according to an embodiment of the invention.
Figure 17:
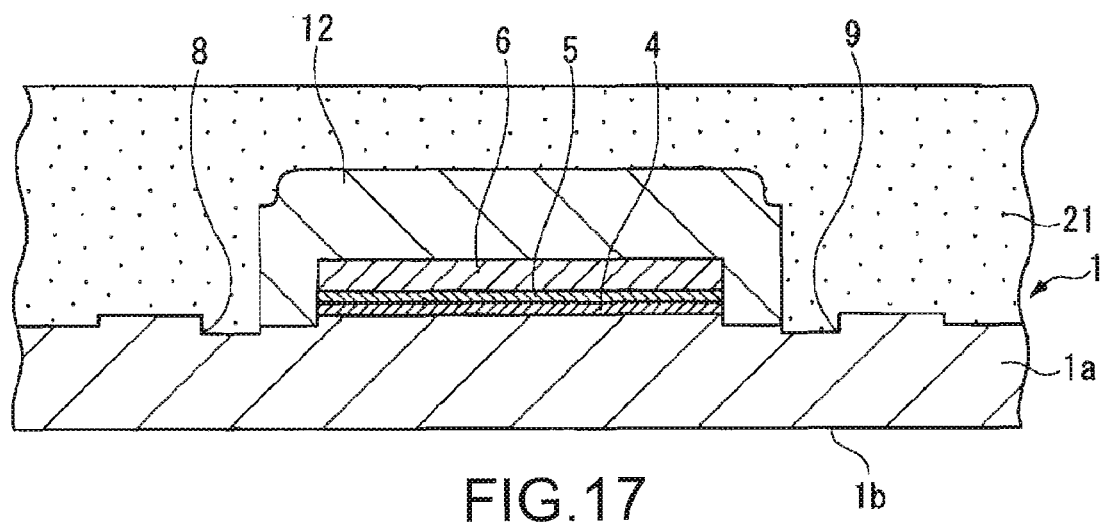
FIG. 17 is a schematic side cross-sectional view for explaining a process of a manufacturing method according to an embodiment of the invention.

After thus forming the end-exposed surfaces, as shown in FIG. 16, the active surface side (the side of the window section 3) of the semiconductor substrate 1 is covered with a photoresist 21. Then, it is dipped (whole-dipping) into hydrofluoric acid as an etching liquid in the present state to remove the silicon dioxide film 2 remaining on the surface layer section of the semiconductor substrate 1 as shown in FIG. 17. Specifically, the silicon dioxide film 2 formed on the surface of the semiconductor substrate 1 on the side opposite to the active surface side and further the side surfaces of the semiconductor substrate 1 is removed to expose the substrate semiconductor layer 1a, thus forming a substrate semiconductor layer exposed surface 1b on the reverse side surface and so on of the semiconductor substrate 1.

When the semiconductor substrate 1 is thus dipped into the hydrofluoric acid (etching liquid), since the support member 12 is also covered with the photoresist 21, in contrast to the case with the first embodiment, the phenomenon that a part of the support member 12 is etched is prevented from occurring.

Figure 18:
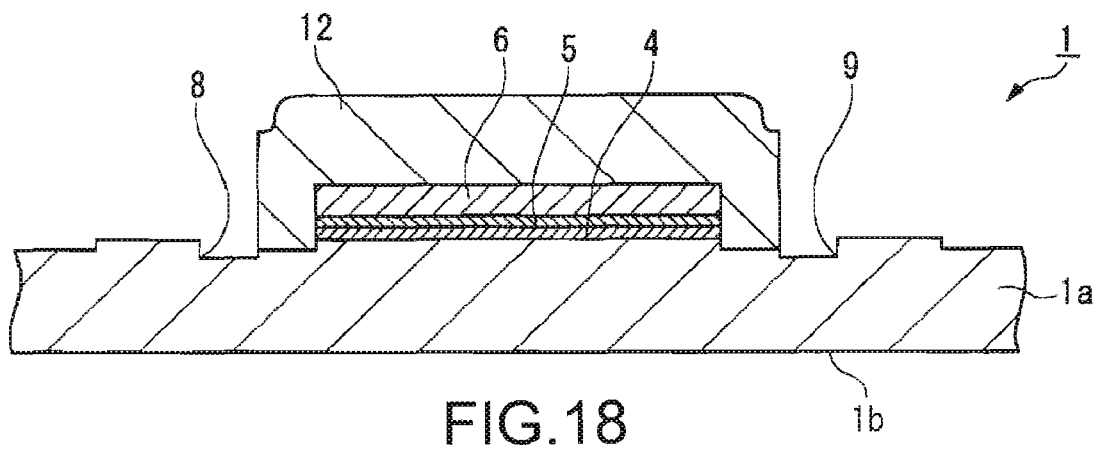
FIG. 18 is a schematic side cross-sectional view for explaining a process of a manufacturing method according to an embodiment of the invention.

After then, as shown in FIG. 18, the photoresist 21 is removed.

Thereafter, similarly to the first embodiment, the single crystal SiGe layer 5 is removed by wet etching to form the hollow section 13, and further, the buried oxide layer 14 is formed by the thermal oxidation Subsequently, the support member 12 is removed to expose the single crystal Si layer 6, and then a semiconductor device (a transistor) is provided to the single crystal Si layer 6. It should be noted that in the case in which the CMP process is used in the step of removing the support member 12, since the protective layer 7 functions as a stopper layer is not provided, the process control is performed by previously obtaining the time period until the single crystal Si layer 6 is exposed by an experiment or the like, and making the process time of the CMP process correspond to the obtained time period. In other words, the CMP process is terminated immediately before the single crystal Si layer 6 is exposed. After then, by performing the wet etching with a hydrofluoric acid type of solution to remove unnecessary silicon dioxide, the single crystal Si layer 6 is exposed. By executing the above process, a problem that a defect is caused in the single crystal Si layer 6 by the CMP process can be prevented.

Since also in this manufacturing method, similarly to the case with the first embodiment, since the single crystal SiGe layer 5 is removed by the wet etching to form the hollow section 13 after removing the silicon dioxide film 2 formed on the reverse side and the side surfaces of the semiconductor substrate 1 to expose the substrate semiconductor layer 1a, the selective etching of the SiGe with hydrofluoric/nitric acid can more preferably be performed, thus the hollow section 13 can be formed so as to preferably penetrate therethrough, and a preferable SOI structure can be formed.

Further, since it is arranged that the wet etching is performed in a condition in which the active surface side of the semiconductor substrate is covered by the photoresist 21 to remove the silicon dioxide film 2 to expose the substrate semiconductor layer 1a, the wet etching can be performed by directly dipping the semiconductor substrate 1 into the etching liquid, and consequently, the process can be made easy.

Then, a third embodiment of a method of manufacturing a semiconductor according to the invention will be explained.

The third embodiment is mainly different from the second embodiment in that the silicon dioxide film 2 on the surface of the semiconductor substrate 1 on the side opposite to the active surface side thereof is removed by dry-etching this surface, thus exposing the substrate semiconductor layer 1a without covering the active surface side of the semiconductor substrate 1 when forming the substrate semiconductor layer exposed surface 1b prior to removing the single crystal SiGe layer 5 by the wet etching.

In other words, in the present embodiment, as shown in FIGS. 15A and 15B, the both side surfaces 12a of the support member 12 are exposed, and the both side surfaces (end faces) of each of the single crystal Si layer 6, the single crystal SiGe layer 5, and the buffer layer 4 are also exposed right below the side surfaces 12a to form the end-exposed surfaces similarly to the second embodiment.

Figure 19:
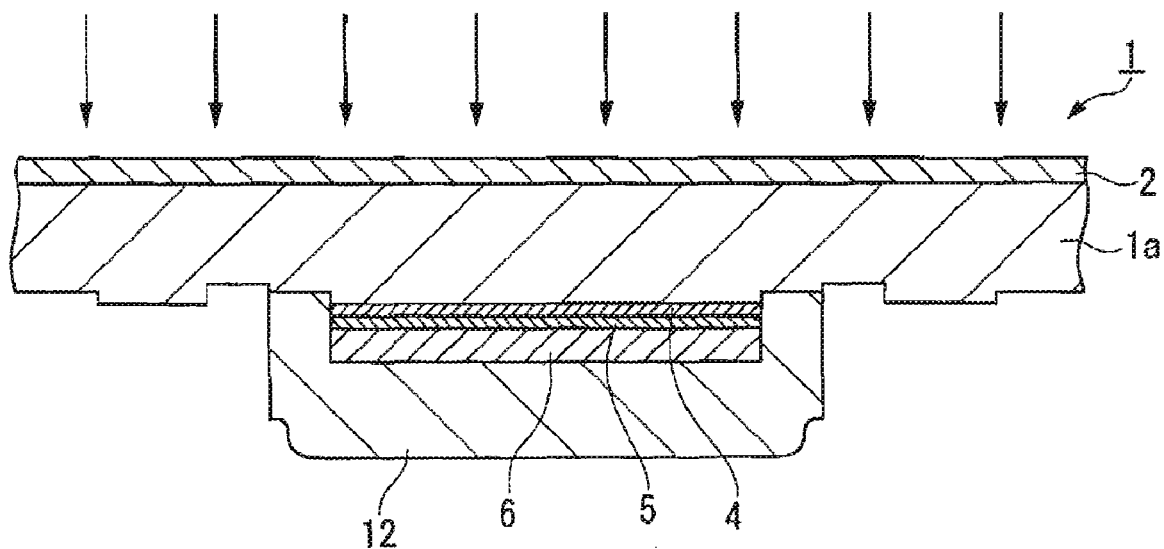
FIG. 19 is a schematic side cross-sectional view for explaining a process of a manufacturing method according to an embodiment of the invention.

Subsequently, as shown in FIG. 19, the semiconductor substrate 1 is turned upside down to set the side (the reverse side) opposite to the active surface side to the upper side. Subsequently, the reverse side is dry-etched to remove the silicon dioxide film 2 of the reverse side to expose the substrate semiconductor layer 1a, thereby forming the substrate semiconductor layer exposed surface on the reverse side of the semiconductor substrate 1.

Subsequently, the semiconductor substrate 1 is turned upside down again to restore the obverse side and the reverse side thereof, thus setting the active surface to the upper side.

Thereafter, similarly to the second embodiment, the single crystal SiGe layer 5 is removed by wet etching to form the hollow section 13, and further, the buried oxide layer 14 is formed by the thermal oxidation. Subsequently, the support member 12 is removed to expose the single crystal Si layer 6, and then a semiconductor device (a transistor) is provided to the single crystal Si layer 6.

Since also in this manufacturing method, similarly to the case with the first and second embodiment, since the single crystal SiGe layer 5 is removed by the wet etching to form the hollow section 13 after removing the silicon dioxide film 2 formed on the reverse side and the side surfaces of the semiconductor substrate 1 to expose the substrate semiconductor layer 1a, the selective etching of the SiGe with hydrofluoric/nitric acid can more preferably be performed, thus the hollow section 13 can be formed so as to preferably penetrate therethrough, and a preferable SOI structure can be formed.

Further, since the surface on the side opposite to the active surface side can selectively be etched by the dry etching process, such a process as to cover the active surface side with a photoresist or the like can be eliminated, thus the process can be simplified.

EXPERIMENTAL EXAMPLE

Using each of the methods of the first, second, and third embodiments, etching of the single crystal SiGe layer 5 with hydrofluoric/nitric acid was executed, for a set period of time (two minutes) after removing the silicon dioxide film 2 in particular on the reverse side of the semiconductor substrate 1. Further, as a comparative related art method, etching with hydrofluoric/nitric acid was executed for the set period of time (two minutes) without removing the silicon dioxide film 2 on, for example, the reverse side of the semiconductor substrate.

According to the examination of the hollow section 13 of each of the semiconductor substrates 1 after etching under a microscope, what is processed by each of the methods of the first, second, and third embodiments of the invention has the hollow section 13 preferably penetrating therethrough. On the other hand, what is processed by the related art method has the hollow section 13 which does not completely penetrate therethrough and has a bridge between the upper and bottom portions remaining unetched.

It should be noted that the invention is not limited to the embodiments described above, but various modifications can be made within the spirit or the scope of the invention. For example, although it is arranged that the buffer layer 4 is formed in the embodiments, it is also possible to form the single crystal SiGe layer 5 directly on the substrate semiconductor layer 1a exposed inside the window section 3 without forming the buffer layer 4.

The entire disclosure of Japanese Patent Application No. 2006-323417, filed Nov. 30, 2006 is expressly incorporated by reference herein.

What is claimed is:

1. A method of manufacturing a semiconductor device, comprising:

forming an oxide film on a surface layer section of an entire surface of a semiconductor substrate;

forming a window section by selectively removing the oxide film from an active surface side of the semiconductor substrate, the window section exposing a substrate semiconductor layer forming the semiconductor substrate;

forming a first semiconductor layer having an etching selection ratio higher than an etching selection ratio of the substrate semiconductor layer so as to cover the substrate semiconductor layer exposed in the window section;

forming a second semiconductor layer having an etching selection ratio higher than the etching selection ratio of the first semiconductor layer so as to cover the first semiconductor layer;

forming a pair of support member holes for exposing the substrate semiconductor layer opened by removing the second semiconductor layer and the first semiconductor layer inside a pair of areas positioned on both sides of an element area section adjacently to the element area section formed using a part of the second semiconductor layer;

forming a support member on the active surface side of the semiconductor substrate so as to cover the element area section and to fill at least a part of each of the support member holes;

forming an end-exposed surface exposing at least a part of an end of the first semiconductor layer below the support member by etching the second semiconductor layer and the first semiconductor layer using the support member as a mask;

forming a substrate semiconductor layer exposed surface by removing at least a part of the oxide film to expose the substrate semiconductor layer after forming the end-exposed surface;

removing the first semiconductor layer below the support member by wet etching;

filling a hollow section obtained by the wet etching with an oxide film using thermal oxidation;

exposing the second semiconductor layer by removing the support member from at least above the element area section; and providing a semiconductor device to the second semiconductor layer.

2. The method of manufacturing a semiconductor device according to claim 1,
wherein the step of forming the substrate semiconductor layer exposed surface includes
covering the active surface side of the semiconductor substrate with a resist, and
exposing the substrate semiconductor layer by executing wet etching to remove at least a part of the oxide film in the condition of covering the active surface side of the semiconductor substrate with the resist in the step of forming the substrate semiconductor layer exposed surface.

3. A method of manufacturing a semiconductor device, comprising:
forming an oxide film on a surface layer section of an entire surface of a semiconductor substrate;
forming a window section by selectively removing the oxide film from an active surface side of the semiconductor substrate, the window section exposing a substrate semiconductor layer forming the semiconductor substrate;
forming a first semiconductor layer having an etching selection ratio higher than an etching selection ratio of the substrate semiconductor layer so as to cover the substrate semiconductor layer exposed in the window section;

forming a second semiconductor layer having an etching selection ratio higher than the etching selection ratio of the first semiconductor layer so as to cover the first semiconductor layer;

forming a protective layer capable of providing an etching selection ratio to the second semiconductor layer so as to cover the second semiconductor layer;

forming a pair of support member holes for exposing the substrate semiconductor layer opened by removing the protective layer, the second semiconductor layer, and the first semiconductor layer inside a pair of areas positioned on both sides of an element area section adjacently to the element area section formed using a part of the second semiconductor layer;

forming a support member capable of providing an etching selection ratio to the protective layer on the active surface side of the semiconductor substrate so as to cover the element area section and to fill at least a part of each of the support member holes;

forming an end-exposed surface exposing at least a part of an end of the first semiconductor layer below the support member by etching the protective layer, the first semiconductor layer, and the second semiconductor layer using the support member as a mask;

forming a substrate semiconductor layer exposed surface by removing at least a part of the oxide film to expose the substrate semiconductor layer after forming the end-exposed surface;

removing the first semiconductor layer below the support member by wet etching;

filling a hollow section obtained by the wet etching with an oxide film using thermal oxidation;

exposing the protective layer by removing the support member from at least above the element area section;

exposing the second semiconductor layer by etching the protective layer; and providing a semiconductor device to the second semiconductor layer.

4. The method of manufacturing a semiconductor device according to claim 3,
wherein the protective layer is made of silicon nitride.

5. The method of manufacturing a semiconductor device according to claim 1,
wherein the step of forming the substrate semiconductor layer exposed surface includes
exposing the substrate semiconductor layer by removing the oxide film on a surface of the semiconductor substrate on a side opposite to the active surface side.

6. The method of manufacturing a semiconductor device according to claim 1,
wherein the step of forming the substrate semiconductor layer exposed surface includes
exposing the substrate semiconductor layer by dry-etching a surface of the semiconductor substrate on a side opposite to the active surface side to remove the oxide film on the surface opposite to the active surface side.

7. The method of manufacturing a semiconductor device according to claim 1,
wherein the substrate semiconductor layer and the second semiconductor layer are made of single crystal silicon, and the first semiconductor layer is made of single crystal silicon-germanium.

8. The method of manufacturing a semiconductor device according to claim 1, further comprising, prior to the step of forming the first semiconductor layer,
forming a buffer layer made of single crystal silicon on the semiconductor substrate.

* * * * *